United States Patent
Dorney

[11] Patent Number: 6,084,811
[45] Date of Patent: Jul. 4, 2000

[54] PHASED SENSE AMPLIFIERS

[75] Inventor: Timothy D. Dorney, Houston, Tex.

[73] Assignee: Texas Instruments Incorporated, Dallas, Tex.

[21] Appl. No.: 09/369,901

[22] Filed: Aug. 6, 1999

Related U.S. Application Data

[60] Provisional application No. 60/096,203, Aug. 12, 1998.

[51] Int. Cl.[7] .................................................. G11C 7/08
[52] U.S. Cl. ........................ 365/208; 365/207; 365/205; 365/222; 365/227; 365/233; 365/194; 365/196
[58] Field of Search ..................... 365/205, 207, 365/208, 222, 227, 233, 194, 196

[56] References Cited

U.S. PATENT DOCUMENTS

| | | | |
|---|---|---|---|
| 4,813,021 | 3/1989 | Kai et al. | 365/194 |
| 5,485,430 | 1/1996 | McClure | 365/233 |
| 5,596,545 | 1/1997 | Lin | 365/236 |
| 5,646,892 | 7/1997 | Masuda et al. | 365/189.05 |
| 5,848,001 | 12/1998 | Kim | 365/190 |
| 6,009,031 | 12/1999 | Te | 365/205 |

*Primary Examiner*—Andrew Q. Tran
*Attorney, Agent, or Firm*—Robby T. Holland; Carlton H. Hoel; Frederick J. Telecky, Jr.

[57] ABSTRACT

A sensing arrangement (100) for a dynamic random access memory (DRAM) is disclosed. The sensing arrangement (100) includes a sense amplifier bank (104) that is logically divided into a number of sense amplifier groups (106-1 to 106-$2^m$). In a read operation, a given number of memory cells are coupled to the sense amplifier bank (104), and one sense amplifier group will provide read data while the remaining sense amplifier groups will refresh memory cell data. A timing circuit (102) receives a timing signal (EVAL) and address information (A1–Am) and in response thereto, enables the sense amplifier group that provides read data before the sense amplifier groups that refresh memory cell data. Peak current is reduced and improved sensing speed result.

6 Claims, 4 Drawing Sheets

PHASED SENSE AMPLIFIERS

This application claims priority under 35 USC § 119(e)(1) of provisional application No. 60/096,203 filed Aug. 12, 1998.

TECHNICAL FIELD

The present invention relates generally to semiconductor memory devices, and more particularly to data sensing circuits for semiconductor memory devices.

BACKGROUND OF THE INVENTION

As the computing speed and data transfer rates of electronic systems has increased, so has the speed at which memory storage devices are required to operate. At the same time, in order to reduce system power consumption, memory storage devices are expected to operate at faster speeds with lower and lower power consumption rates. Among the common types of memory storage devices that are currently employed in electronic systems are various random access memories (RAMS), such as dynamic RAMs (DRAMs) and static RAMs (SRAMs), as well as read only memories (ROMs), such as electrically erasable programmable ROMs (EEPROMs).

In a typical RAM or ROM, the memory device will include a very large number of memory cells arranged into one or more arrays. Each of the memory cells stores a given data value. Data within the memory cell can be accessed by a read or write operation (in the case of a RAM), or a read or program operation (in the case of a ROM). In most RAMs and ROMs, the memory cells are accessed by the application of a row address, which couples a row of memory cells to bit lines. An applied column address will then provide access to selected of the bit lines. The manner by which the row and column addresses are applied varies according to particular memory device type. For example, in conventional DRAMs the row and column address are multiplexed, with the row address being applied first, followed by a column address. In contrast, other higher speed memory devices, such as SRAMs, receive row and column addresses simultaneously. In addition, more current DRAM architectures rely on "packetized" interfaces, in which row and column addresses are received in the same packet of information.

In most memory devices, when a row of memory cells is coupled to the bit lines, data signals are generated on the bit lines. In order to maintain as compact a memory device size as possible, the memory cells are usually manufactured to be as small as possible, resulting in the data signals from the memory cells being correspondingly small (i.e., a small current signal or small voltage signal). In order to translate such small bit line data signals into usable output data signals, the memory device will usually include a bank of sense amplifiers that "sense" the small logic value on a bit lines, and then amplify them to a more usable logic level. Because bit line data signals must first be sensed before they are output, the speed at which such signals can be amplified by sense amplifiers plays an important role in the overall speed of a semiconductor memory device.

In order to amplify bit line data, the typical sense amplifier bank will charge or discharge each bit line according to the sensed memory cell data value. In order to charge the relatively large capacitive load presented by a bit line, a sense amplifier will have to draw current from a supply voltage. Thus, the amplification operation of sense amplifiers can consume considerable current. Current consumption translates directly into power consumption.

In addition to amplifying bit line cell signals to generate output signals, the sense amplifier bank operation also plays an additional role when the memory device is a DRAM. DRAM memory cells typically store data values by charging or discharging a storage capacitor situated within each memory cell. Because stored charge can leak out over time, the charge within such a capacitor must be refreshed in order to preserve the data value. Thus, when a sense operation charges a bit line, the associated storage capacitor will also be charged, refreshing the data value stored within.

A typical DRAM will include a number of memory cell arrays. In a conventional read and refresh arrangement, each memory cell array will include a corresponding sense amplifier bank. Each sense amplifier bank will be coupled to the bit lines of its corresponding memory cell array, and have as many sense amplifiers as there are memory cells in the rows of the array. This allows memory cell data to be refreshed on a row-by-row basis. In this arrangement, in a read or refresh operation, a row of memory cells will be coupled to the bit lines, and hence to a bank of sense amplifiers. The sense amplifier bank is then activated, resulting in the bit lines being charged or discharged simultaneously according to the data on the bit lines. Other approaches have "graded" the turn on of sense amplifiers within a bank, by initially supplying current to the sense amplifiers at one rate, and then increasing the rate.

Due the large number of sense amplifiers in a sense amplifier bank, the current drawn by a memory device can reach a peak when its sense amplifier banks are activated. The peak current is of concern as it translates directly into the amount of power consumed by the semiconductor memory device, and requires that the power supply circuits of the device, and/or the system in which the device is being used, be capable of supplying this peak current. Large peak currents also create unwanted noise on the memory device power supply buses, thus adversely affecting the operation of a memory device.

It would be desirable to provide some way of reducing the peak current drawn by a memory device without adversely affecting the speed of the memory device.

SUMMARY OF THE INVENTION

According to the preferred embodiment, a phased sensing arrangement for a dynamic random access memory (DRAM) includes a sense amplifier bank that is divided into a number of sense amplifier groups. In a read operation, rather than activate all of the sense amplifiers simultaneously, the sense amplifier group that provides the read data will be enabled prior to the remaining sense amplifier groups, reducing peak current, and providing for a more rapid read response than a conventional approach. Following the enabling of the first sense amplifier group, the remaining sense amplifier groups, which only serve to refresh data, will be enabled.

According to one aspect of the preferred embodiment, a timing signal generator provides a timing signal and a delayed timing signal. According to an applied address signal, a timing decoder circuit utilizes the timing signal to enable the sense amplifier group that provides read data, while the delayed timing signal is utilized to enable the remaining sense amplifier groups, that serve only to refresh data.

DETAILED DESCRIPTION OF THE EMBODIMENTS

The preferred embodiment will be described in terms of a preferred dynamic random access memory (DRAM) embodiment in which a row of memory cells are accessed in a read operation. To reduce the peak current drawn in a read operation, while at the same time maintaining refresh operations, the sense amplifiers within a bank are turned on in phased groups, with one group being turned on before the others. The group of sense amplifiers required for the read operation are turned on first, allowing the remaining sense amplifiers, which are only required for refresh purposes, to be turned on afterward. The appropriate group of sense amplifiers is activated before the others by utilizing address information to activate each sense amplifier group.

Figure 1:
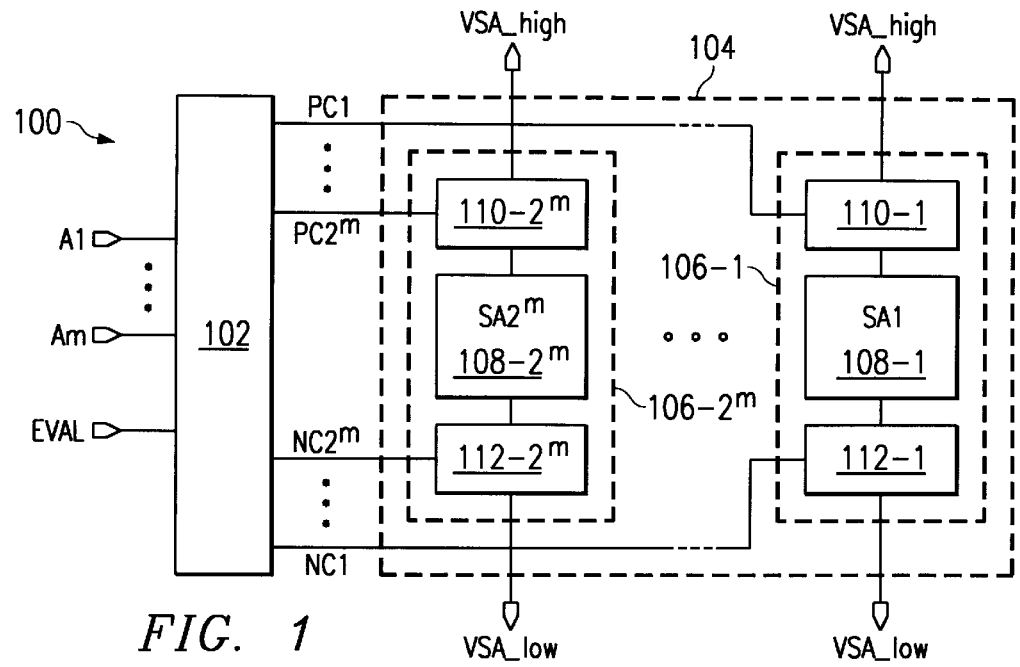
FIG. 1 is a block schematic diagram illustrating a preferred embodiment phased sensing arrangement.

Referring now to FIG. 1 a preferred embodiment is set forth in a block schematic diagram. The preferred embodiment is designated by the general reference character 100, and is shown to include a phased sense amplifier timing circuit 102 coupled to a bank of sense amplifiers 104. The timing circuit 102 is shown to receive a number of address signals, shown as A1–Am. In addition, the timing circuit 102 receives a timing signal EVAL. In response the address signals (A1–Am) and the EVAL signal, the timing circuit 102 provides a number of sense amplifier control signals, including a number of first control signals (PC1–PC2$^m$) and second control signals (NC1–NC2$^m$). Each first control signal activates a given group of sense amplifiers by enabling a current supply path between a first supply voltage and the group of sense amplifiers. Similarly, each second control signal activates a given group of sense amplifiers by enabling a current path between a second supply voltage and the group of sense amplifiers. In the particular arrangement of FIG. 1, it is shown that "m" address signals can result in $2^m$ first control signals and $2^m$ second control signals. Further, each first control signal (PC1–PC2$^m$) has a corresponding second control signal (NC1–NC2$^m$). Thus first control signal PC1 would correspond to second control signal NC1, and first control signals PC2 and PC2$^m$ would correspond to second control signals NC2 and NC2$^m$, respectively.

In a given read operation, according to the address signals (A1–Am), one corresponding pair of control signals (PC1/NC1–PC2$^m$/NC2$^m$) will be activated before the remaining pairs of control signals. Which pair of control signals is activated first depends upon which sense amplifiers will be providing read output data. For example, in response to an applied external address, the address signals A1–Am could all be driven low. In such an event, the control signal pair PC1/NC1 would initially be activated (with PC1 going low and NC1 going high) before the remaining control signals pairs (PC2/NC2–PC2$^m$/NC2$^m$). After a predetermined delay, the remaining control signals pairs (PC2/NC2–PC2$^m$/NC2$^m$) would be activated.

The preferred embodiment 100 sense amplifier bank 104 receives the first and second control signals (PC1–PC2$^m$ and NC1–NC2$^m$) as inputs. The sense amplifier bank 104 is shown to be situated between a first sense amplifier supply voltage VSA_high and a second sense amplifier supply voltage VSA_low. The two sense amplifier supply voltages (VSA_high and VSA_low) provide power to the sense amplifier bank 104, enabling it to drive bit lines between high and low logic values. The sense amplifier supply voltages (VSA_high and VSA_low) may be power supply voltages, or alternatively, supply voltages generated on the memory device, that are either greater than or less than the power supply voltages provided to the memory device.

The sense amplifier bank 104 is shown to be logically divided into groups, with each group being coupled to a control line pair (PC1/NC1–PC2$^m$/NC2$^m$). In FIG. 1, two of the sense amplifier groups are shown as 106-1 to 106-2$^m$. Sense amplifier group 106-1 is shown to receive the control signal pair (PC1/NC1) and sense amplifier group 106-2$^m$ is shown to receive the control signal pair (PC2$^m$/NC2$^m$).

Each sense amplifier group (106-1 to 106-2$^m$) includes an amplifier circuit (108-1 to 108-2$^m$), a first supply circuit (110-1 to 110-2$^m$) and a second supply circuit (112-1 to 112-2$^m$). Each amplifier circuit (108-1 to 108-2$^m$) can include one or more sense amplifiers for sensing the data value on one or more bit lines, or one or more bit line pairs, and amplifying that data value to provide read data and/or to refresh the data of memory cells coupled to the bit lines. The amplifier circuits (108-1 to 108-2$^m$) are each enabled by the activation of their corresponding first supply circuit (110-1 to 110-2$^m$) and a second supply circuit (112-1 to 112-2$^m$). For example, amplifier circuit 106-1 will be enabled when first supply circuit 110-1 and second supply circuit 112-1 are activated.

The first supply circuits (110-1 to 110-2$^m$) each receive one of the first control signals (PC1–PC2$^m$), and in the preferred embodiment 100, are activated by their respective first control signal (PC1–PC2$^m$) going low. When activated, a first supply circuit (110-1 to 110-2$^m$) will provide a current path between the first sense amplifier supply voltage VSA_high and its corresponding sense amplifier group (108-1 to 108-2$^m$). For example, when the first control signal PC1 goes low, the first supply circuit 110-1 will be activated, providing a current path between amplifier circuit 108-1 and the first sense amplifier supply voltage VSA_high. This enables the amplifier circuit 108-1 to charge selected bit lines by utilizing the first sense amplifier supply voltage VSA_high.

In the same general fashion as the first supply circuits (110-1 to 110-2$^m$), the second supply circuits (112-1 to 112-2$^m$) each receive, and are activated by, one of the second control signals (NC1–NC2$^m$). An activated second supply circuit (112-1 to 112-2$^m$) will provide a current path between the second sense amplifier supply voltage VSA_low and its corresponding sense amplifier group (108-1 to 108-2$^m$). For example, when the second control signal NC1 goes high, the second supply circuit 112-1 will be activated, providing a current path from the VSA_low voltage to amplifier circuit 108-1. This enables the amplifier circuit 108-1 to discharge selected bit lines, by coupling the bit lines to the VSA_low voltage.

As noted previously, the control signals (PC1–PC2$^m$ and NC1–NC2$^m$) are driven to an active state in corresponding pairs (PC1/NC1–PC2$^m$/NC2$^m$), with one particular pair being driven first, and the remaining pairs being driven afterward. Accordingly, this timing arrangement results in one amplifier circuit (108-1 to 108-2′′′) being enabled before the others, and initially drawing current for an amplification operation. Subsequently, the remaining amplifier circuits will be enabled and also draw current. This enabling sequence reduces the amount of peak current drawn by the sense amplifier bank 104. For example, if the applied address results in amplifier circuit 108-1 being enabled first, amplifier circuit 108-1 will draw current and begin to charge or discharge those bit lines that need to be driven high or low, respectfully. By the time the remaining amplifier circuits (108-2 to 108-2′′′) are enabled, the bit lines coupled to amplifier circuit 108-1 have already been driven, or at least partially driven to the appropriate voltage. As a result, less peak current will be drawn than the conventional case in which all of the amplifier circuits (108-2 to 108-2′′′) are activated simultaneously. Also, since amplifier circuit 108-1 is initially the only amplifier circuit being activated, the reduced current from VSA_high or VSA_low allows a faster response to the state of the bit lines, or bit line pairs, than if all amplifier circuits are activated simultaneously. This provides a faster read access in the example.

Figure 2:
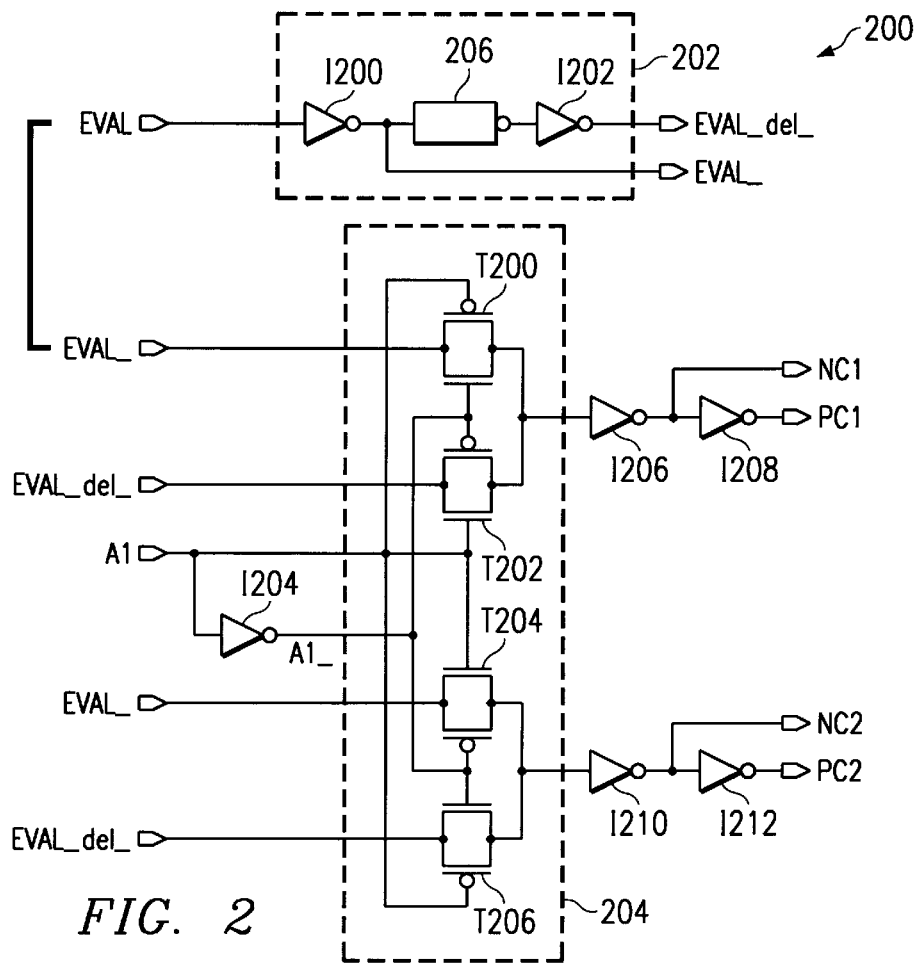
FIG. 2 is a schematic diagram illustrating a timing circuit of the preferred embodiment.

Referring now to FIG. 2, a schematic diagram is set forth illustrating a timing circuit according to the preferred embodiment. The timing circuit may be utilized as the timing circuit shown as item 102 in FIG. 1. The timing circuit set forth in FIG. 2 illustrates the case where the variable "m" is equal to 1. In such a case, only one address signal A1 will be received by the timing circuit, and only two pairs of timing signals (PC1/NC1 and PC2/NC2) will be generated.

In FIG. 2, the timing circuit is designated by the general reference character 200, and is shown to include a timing signal generator 202 and a timing decoder circuit 204. The timing signal generator 202 receives the timing signal EVAL and generates a delayed version of the timing signal, shown as $EVAL_{13}$ del_. In addition, the particular timing signal generator 202 of FIG. 2 also provides an inverted timing signal $EVAL_{13}$ . An input inverter I200 receives the EVAL signal and provides the $EVAL_{13}$ signal as an output. The $EVAL_{13}$ signal is also applied to a falling edge delay circuit 206. The falling edge delay circuit 206, as the name implies, will delay and invert the falling edge of the EVAL_signal. In this way, a delayed timing signal is generated. The output of the falling edge delay circuit 206 is coupled to the input of an inverter I202, which provides the $EVAL_{13}$ del_signal as an output.

The timing decoder circuit 204 includes four complementary metal(conductor)-oxide(insulator)-semiconductor (CMOS) transfer gates T200, T202, T204 and T206. Transfer gates T200 and T204 receive the $EVAL_{13}$ signal as an input, and transfer gates T202 and T206 receive the $EVAL_{13}$ del_signal as inputs. The transfer gates (T200, T202, T204 and T206) are enabled according to the value of the A1 signal. In particular, transfer gates T202 and T204 are enabled by a high A1 signal, and transfer gates T200 and T206 are enabled by a low A1 signal. The outputs of transfer gates T200 and T202 are commonly coupled to the input of an inverter I206. The output of inverter I206 provides the NC1 signal. The NC1 signal is inverted by another inverter I208 to generate the PC1 signal. In a similar fashion, the outputs of transfer gates T204 and T206 are coupled to the input of an inverter I210, which generates the NC2 signal. The NC2 signal is inverted by an inverter I212 to generate the PC2 signal.

Figure 3:
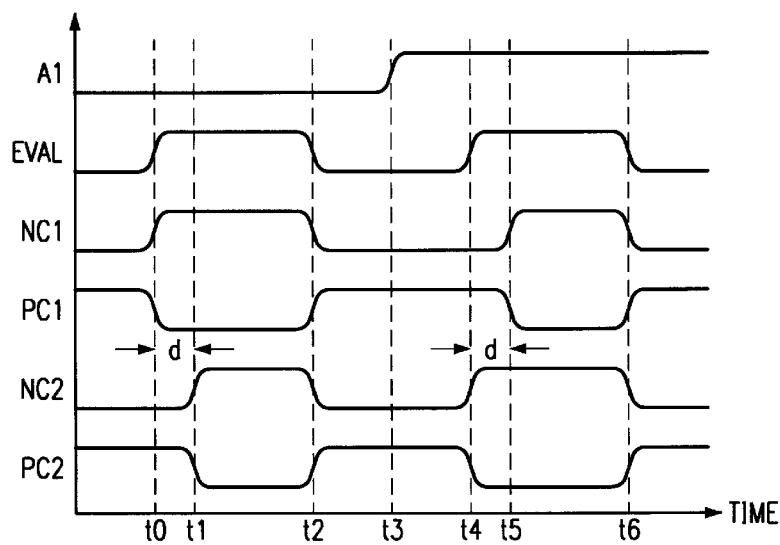
FIG. 3 is a timing diagram illustrating the operation of the timing circuit of FIG. 2.

Referring now to FIG. 3, a timing diagram is set forth illustrating the operation of the timing circuit of FIG. 2. The timing diagram sets forth the A1 signal, the EVAL signal, and the resulting control signals NC1, PC1, NC2 and PC2. Referring now to FIG. 3 in conjunction with FIG. 2, the operation of the preferred timing circuit 200 will be described.

Prior to time t0, the A1 signal is low and the EVAL signal is low. Within the timing signal generator 202, the EVAL signal is inverted by inverter I200 to generate a high EVAL_signal. The EVAL_signal is inverted by the falling edge delay circuit 206 and inverter I202 to generate a high $EVAL_{13}$ del_signal. With the A1 signal low, transfer gates T200 and T206 are enabled. The high EVAL_signal is applied to inverter I206 by way of transfer gate T200, resulting in a low NC1 signal and a high PC1 signal. The high $EVAL_{13}$ del_signal is applied to inverter I210 by way of transfer gate T206, resulting in a low NC2 signal and a high PC2 signal.

At time t0, the EVAL signal transitions high, indicating an active cycle. For the purposes of illustration, it is assumed that at time t0, the address applied has selected those bit lines coupled to the sense amplifier group 106-1. Thus, the control signals PC1 and NC1 will activate the sense amplifiers that are to provide the read data. Referring to FIG. 2 and FIG. 3, as the EVAL signal goes high, the $EVAL_{13}$ signal will be driven low by inverter I200. Due to the low value of address signal A1, transfer gates T200 and T206 remain turned on, while transfer gates T202 and T204 remain turned off. The low-going EVAL_transition is thus coupled, via transfer gate T200, to the input of inverter I206. Inverter I206 inverts the low-going $EVAL_{13}$ signal to generate a high-going NC1 signal. The NC1 signal is inverted by inverter I208 to generate a low-going PC1 signal. The high NC1 signal and low PC1 signal result in the sense amplifier group 106-1 being activated before the other sense amplifier group 106-2.

also at time t0, the high-going EVAL signal transition begins propagating through the falling edge delay circuit 206, thus the $EVAL_{13}$ del_signal will remain high. With transfer gate T206 turned on, the high $EVAL_{13}$ del_signal continues to generate a low NC2 signal and high PC2 signal. In this manner, initially following the EVAL signal high transition, the sense amplifier group that does not provide read data (sense amplifier group 106-2 in the example of FIG. 3), will remain disabled. Of course, in the event m>1, the remaining sense amplifier groups 106-2 to 106-2′′′ would also remain disabled.

At time t1, the EVAL signal remains high and the address signal A1 remains low, resulting in the NC1 and PC1 signals continuing to be high and low, respectively. At the same time, the low-going EVAL_signal transition passes through the falling edge delay circuit 206, resulting in a rising edge being applied to the input of inverter I202. Consequently, the $EVAL_{13}$ del_signal transitions low. Because of the low A1 signal value, transfer gate T206 remains turned on, and the low-going $EVAL_{13}$ del_signal transition is applied to the input of inverter I210. The NC2 signal is thus driven high and the PC2 signal is driven low. In this manner, a given delay following the EVAL signal transition, those sense amplifier groups that perform only a refresh function will be enabled.

At time t2, the EVAL signal returns low, while the A1 address signal remains low. Inverter I200 drives the $EVAL_{13}$ signal high. Because the falling edge delay circuit 206 only delays the falling edge of the EVAL_signal, inverter I202 drives the $EVAL_{13}$ del_signal high at time t2 as well. Due to the low A1 value, the high EVAL_signal is coupled to inverter I206 by transfer gate T200 and the high EVAL_ del_signal is coupled to inverter I210 by transfer gate T206.

Consequently, the NC1 and NC2 signals return low, while the PC1 and PC2 signals return high. In this manner, all of the sense amplifier groups are disabled in an essentially simultaneous fashion.

At time t3, the A1 signal transitions high, indicating a change in address that results in read data being provided from sense amplifier group 106-2 instead of sense amplifier group 106-1. The high A1 signal value results in transfer gates T200 and T206 being turned off, and transfer gates T202 and T204 being turned on. However, because the EVAL signal remains low, the EVAL_ and $EVAL_{13}$ del_ signals remain high. Consequently, when the transfer gates T202 and T204 are turned on, the input of inverters I206 and I210 remain high, resulting in the NC1 and NC2 signals remaining low and the PC1 and PC2 signals remaining high.

At time t4, the EVAL signal transitions high once again, indicating an active cycle in which sense amplifier group 106-2 provides read data while sense amplifier group 106-1 serves a refresh function only. As the EVAL signal goes high, the EVAL_ signal will be driven low once again. However, because the address signal A1 is high, transfer gate T200 is turned off and transfer gate T204 is turned on, and the low-going $EVAL_{13}$ signal will be coupled to inverter I210. As a result, the NC2 signal will transition high and the PC2 signal will transition low. The high NC2 signal and low PC2 enable the sense amplifier group 106-2, which provides read output data.

Also at time t4, the low-going EVAL_ signal begins to propagate through the falling edge delay circuit 206. Due to the delay, the $EVAL_{13}$ del_ signal will remain high at time t4. With transfer gate T202 turned on, the high $EVAL_{13}$ del_ signal continues to be applied to the input of inverter I206, resulting in the NC1 signal and the PC1 signal remaining low and high, respectively. In this manner, once the address switches (A1 goes high), following the EVAL signal high transition, the sense amplifier group 106-2 that is to provide read output data will be enabled, while the remaining sense amplifier groups (sense amplifier group 106-1 in the case of FIG. 1) will remain disabled.

At time t5, the EVAL signal and the A1 signal remain high, resulting in the NC2 and PC2 signals continuing to be high and low, respectively. However, also at time t5, the low-going $EVAL_{13}$ signal completes its passage through the failing edge delay circuit 206 and inverter I202, and drives the $EVAL_{13}$ del_ signal low in response. With the A1 signal high, transfer gate T202 remains turned on, and the low-going $EVAL_{13}$ del_ signal is applied to the input of inverter I206. The NC1 signal is driven high, and by operation of inverter I208, the PC1 signal is driven low. Once again, for a given delay following the EVAL signal transition, those sense amplifier groups that perform only a refresh function will be enabled.

At time t6, the EVAL signal returns low. The EVAL_ and $EVAL_{13}$ del_ signals are driven high, essentially simultaneously. With transfer gates T202 and T204 turned on, due to the high A1 value, the high EVAL_ signal is applied to the input of inverter I210, and the high $EVAL_{13}$ del_ signal is applied to the input of inverter I206. This results in both sets of control signals (NC1/PC1 and NC2/PC2) returning to the inactive state.

Figure 4:
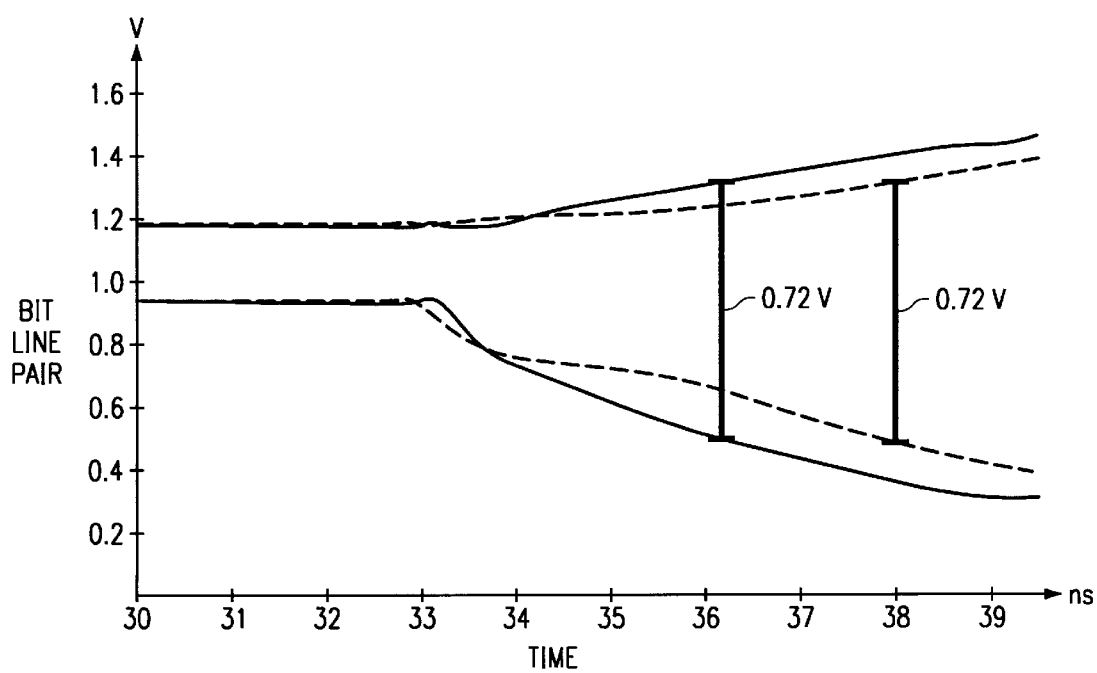
FIG. 4 is a timing diagram illustrating the response of a conventional sense amplifier bank and the response of one version of the preferred embodiment.

Referring now to FIG. 4, a timing diagram is set forth comparing a conventional sense amplifier response to the response of the preferred embodiment. FIG. 4 illustrates the resulting voltages for a pair of complementary bit lines driven by a sense amplifier within a sense amplifier bank. In the case of the conventional response, represented by dashed lines, all of the sense amplifiers within the bank are activated simultaneously. In the response of the preferred embodiment, represented by solid lines, one half of the sense amplifiers are activated a predetermined period before the other half. Thus, the response represents the case where m=1, resulting in the sense amplifier bank including two phased sense amplifier groups.

As shown in FIG. 4, in the conventional case, the sense amplifier bank is activated at about the 33 ns time mark, resulting in the bit line pair "splitting" so that one bit line rises in potential while the other drops in potential. The conventional (dashed line) case reaches a split value (voltage differential) of 0.72 volt at about the 38 ns time mark. Thus, the conventional approach requires approximately 5 ns to achieve a 0.72 volt split. In contrast, the preferred embodiment provides a faster response. While the preferred embodiment response also begins splitting at about the 33 ns time mark, the preferred embodiment (solid line) case reaches a split value of 0.72 volt at about the 36.2 ns time mark. Thus, the preferred embodiment approach requires 3.2 ns to achieve the same 0.72 split, an improvement of about 1.8 ns. In this manner, the preferred embodiment approach not only reduces peak current, but, by initially providing current to only one group of sense amplifiers, results in a faster read response than the conventional approach.

Figure 5A:
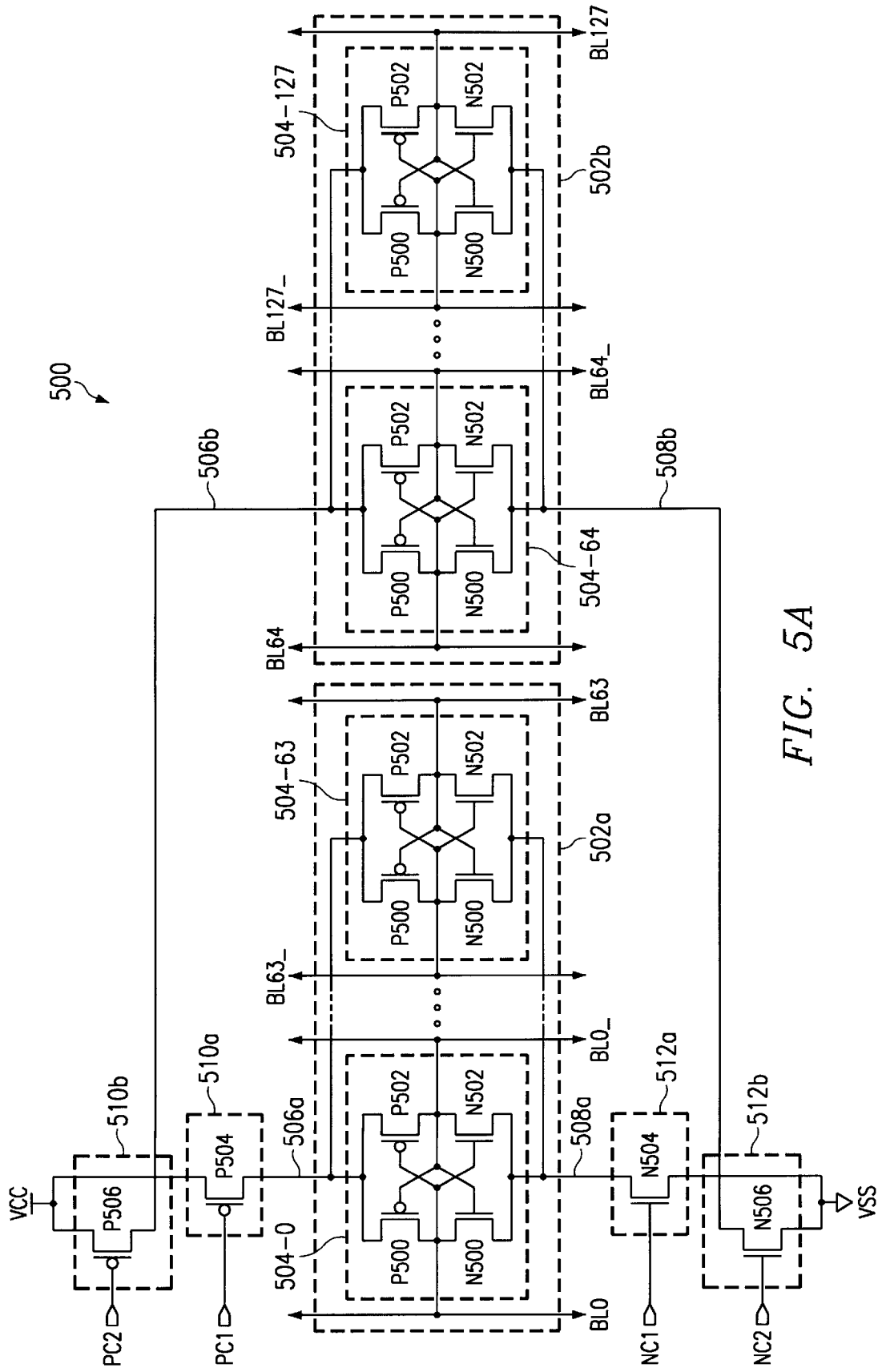
FIG. 5A is a detailed schematic diagram illustrating one sense amplifier bank that may be used in the preferred embodiment.

Referring now to FIG. 5A, a schematic diagram is set forth illustrating one possible sense amplifier bank that may be used in the preferred embodiment. The particular embodiment of FIG. 5A sets forth a sense amplifier bank having 128 sense amplifiers divided into two groups. The two groups each receive power via a pair of single switching devices. The sense amplifier bank is designated by the general reference character 500 and includes a first amplifier circuit 502a and a second amplifier circuit 502b. The first amplifier circuit 502a includes sixty-four sense amplifiers, represented by sense amplifiers 504-0 to 504-63. The sense amplifiers (504-0 to 504-63) are commonly coupled to a first group high supply node 506a and a first group low supply node 508a. The second amplifier circuit 502b is like the first amplifier circuit 502a, including sixty-four sense amplifiers (504-64 to 504-127) commonly connected to a second group high supply node 506b and a second group low supply node 508b.

Each sense amplifier (504-0 to 504-127) is shown to include a first inverter (formed by complementary MOS transistors P500/N500) cross-coupled with a second inverter (formed by complementary MOS transistors P502/N502). Furthermore, each sense amplifier (504-0 to 504-127) is shown to be disposed between a corresponding pair of complementary bit lines (BL0/BL0_ to BL127/BL127_). The amplifier circuits 502a and 502b can be conceptualized as corresponding to amplifier circuits 108-1 and 108-2 (i.e., m=1) of FIG. 1.

The sense amplifier bank 500 further includes first supply circuits 510a and 510b and second supply circuits 512a and 512b. The first supply circuit 510a is shown to include p-channel MOS transistor P504 having source-drain path coupled between the first group high supply node 506a and a high power supply voltage VCC. Transistor P504 is turned on by a low PC1 signal. In the same general fashion, the first supply circuit 510b includes a p-channel MOS transistor P506 having a source-drain path coupled between the second group high supply node 506b and the VCC voltage. The gate of transistor P506 receives the PC2 signal. First supply circuits 506a and 506b can be conceptualized as corresponding to first supply circuits 110-1 and 110-2 (i.e., m=1) in FIG. 1.

The sense amplifier bank 500 also includes second supply circuits 512a and 512b that couple the first and second group low supply nodes (508a and 508b, respectively) to the low power supply voltage VSS. The second supply circuits (512a and 512b) each include an n-channel MOS transistor (N504 and N506) having a source-drain path coupled to the low power supply voltage VSS. Transistor N504 has a gate that receives the NC1 signal, and transistor N506 has a gate that receives the NC2 signal. Second supply circuits 512a and 512b can be conceptualized as corresponding to second supply circuits 112-1 and 112-2 (i.e., m=1) in FIG. 1.

Figure 5B:
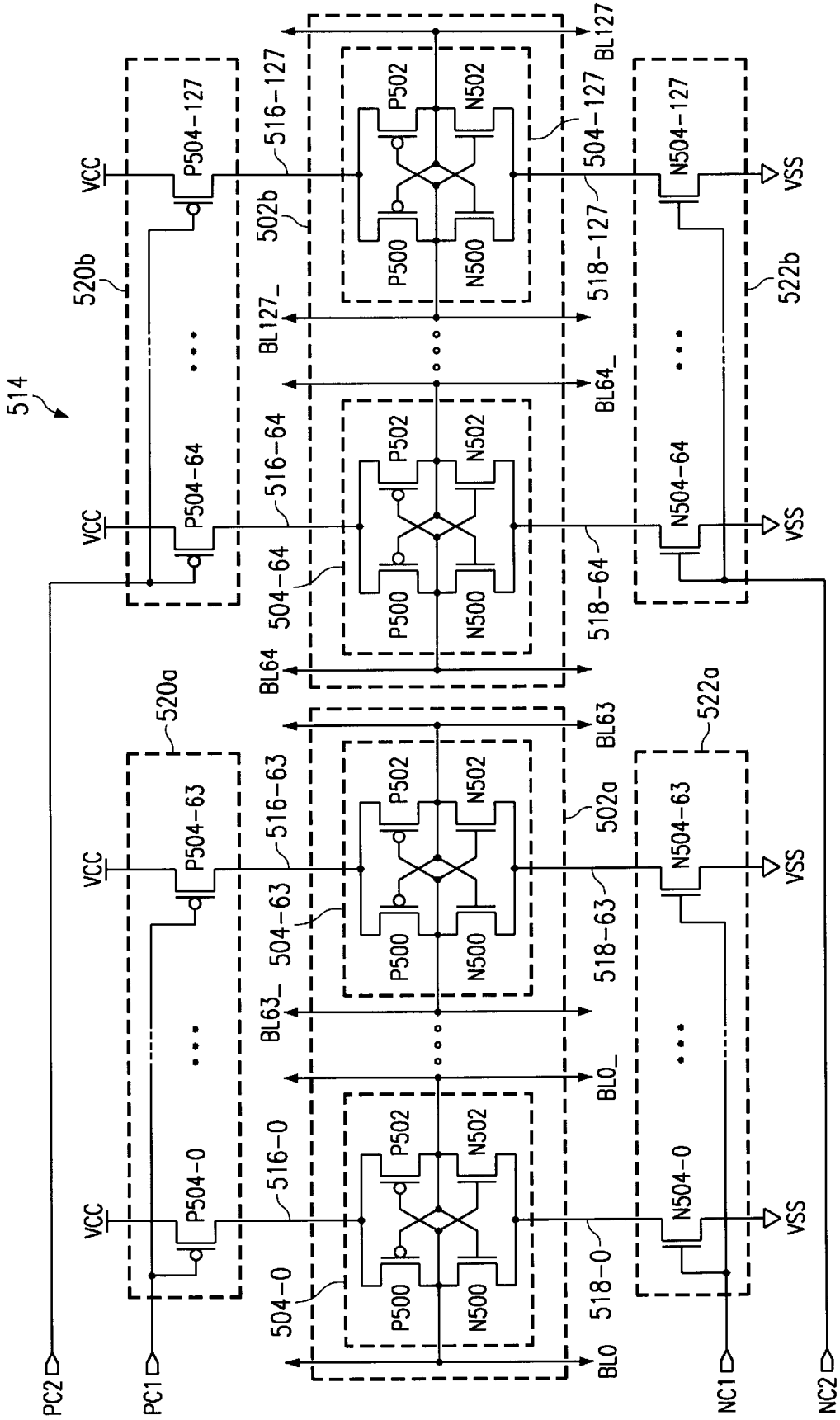
FIG. 5B is a detailed schematic diagram illustrating another sense amplifier bank that may be used in the preferred embodiment.

Referring now to FIG. 5B, a schematic diagram is set forth illustrating a second possible sense amplifier bank that may be used in the preferred embodiment. The particular embodiment of FIG. 5B, like that of FIG. 5A, includes 128 sense amplifiers divided into two groups. Unlike the example of FIG. 5A, each sense amplifier of FIG. 5B has its own pair of switching devices, with the switching devices of the same sense amplifier group being commonly activated.

The sense amplifier bank of FIG. 5B includes many of the same circuit sections as that of FIG. 5A, and so like sections will be referred to by the same reference character. Accordingly, the second sense amplifier bank of FIG. 5B is designated by the general reference character 514 and includes a first amplifier circuit 502a, having sixty-four sense amplifiers (504-0 to 504-63), and a second amplifier circuit 502b, also having sixty-four sense amplifiers (504-64 to 504-127). The sense amplifiers (504-0 to 504-127) are formed in the same manner as FIG. 5A, each including four transistors (P500, P502, N500 and N502) and being disposed between a corresponding pair of bit lines (BL0/BL0__ to BL127/BL127__).

Unlike the arrangement of FIG. 5A, in the sense amplifier bank 514 of FIG. 5B, each sense amplifier (504-0 to 504-127) has a corresponding first supply node (516-0 to 516-127) and a second supply node (518-0 to 518-127). As a result, while the sense amplifier bank 514 includes two first supply circuits (520a and 520b), the supply circuit 520a includes a p-channel MOS transistor (P504-0 to P504-63) corresponding to each first supply node (516-0 to 516-63) within the first amplifier circuit 502a. Correspondingly, the first supply circuit 520b includes a p-channel MOS transistor (P504-64 to P504-127) corresponding to each first supply node (516-64 to 516-127) within the second amplifier circuit 502b. The transistors (P504-0 to P504-63) of the first supply circuit 520a have gates that are commonly coupled to the PC1 signal. The transistors (P504-64 to P504-127) of first supply circuit 520b have gates that are commonly coupled to the PC2 signal.

Connections between the sense amplifiers (504-0 to 504-127) and the low power supply voltage VSS are accomplished in a similar fashion to the high power supply VCC connections. Two second supply circuits (522a and 522b) are included, with second supply circuit 522a including a n-channel MOS transistor (N504-0 to N504-63) corresponding to each second supply node (518-0 to 518-63) of the first amplifier circuit 502a. Second supply circuit 522b includes a n-channel MOS transistor (N504-64 to N504-127) corresponding to each second supply node (518-64 to 518-127) of the second amplifier circuit 502b. Transistors N504-0 to N504-63 are commonly enabled by the NC1 signal. Transistors N504-64 to N504-127 are commonly enabled by the NC2 signal.

It is understood that while two possible sense amplifier banks have been set forth in FIGS. 5A and 5B, this should not be construed as limiting the invention thereto. Other sense amplifier banks could be employed that are subdivided so as to activate selected sense amplifier groups faster than others, according to an address value. Similarly, it is repeated that many of the examples set forth herein represent the limited case in which the sense amplifier bank is divided into only two groups. Thus, while the present invention has been described in terms of detailed preferred embodiments, various changes, substitutions, and alterations could be made without departing from the spirit and scope of the invention. Accordingly, the present invention is intended to be limited only as defined by the appended claims.

What is claimed is:

1. A semiconductor device sensing circuit, comprising:
    a sense amplifier bank including a plurality of sense amplifier groups, each sense amplifier group including a number of sense amplifiers that are commonly enabled by a predetermined potential at a group control node; and
    a timing circuit that generates a different timing control signal at the group control node of each sense amplifier group, the timing circuit delaying at least one of the timing control signals with respect to the other timing control signals according to an address value.

2. The sensing circuit of claim 1, wherein:
    each sense amplifier group includes
        a plurality of sense amplifiers, each sense amplifier including at least one supply node and being enabled by coupling the supply node to a sense amplifier supply voltage, and
        a supply circuit that provides a low impedance path between the sense amplifier supply voltage and the supply nodes of the sense amplifier group when the predetermined potential is applied to the group control node of the sense amplifier group.

3. The sensing circuit of claim 1, wherein:
    the timing circuit includes
        a timing signal generator that includes a delay circuit that delays the timing control signal to generate the delayed timing control signal, and a plurality of gate device pairs associated with each sense amplifier group, each gate device pair including
            a first gate device coupled between the timing signal generator and the group control node of its associated sense amplifier group, the first gate device coupling the timing control signal to the group control node when the address has a first predetermined value, and
            a second gate device coupled between the timing signal generator and the group control node of its associated sense amplifier group, the second gate device coupling the delayed timing control signal to the group control node when the address has a second predetermined value.

4. In a semiconductor memory device that accesses memory cells according to an applied address to provide read data values, a sensing scheme comprising:
    a plurality of sense amplifiers arranged into a sense amplifier bank, the sense amplifier bank being coupled to an array of memory cells and being logically arranged into sense amplifier groups, each sense amplifier group receiving a different control signal, and being enabled when its associated control signal is activated; and
    a timing circuit that generates the control signal for each sense amplifier group, the timing circuit receiving address information and activating at least one control signal prior to the other control signals to enable the sense amplifier group that provides the read data values.

5. The sensing scheme of claim 4, wherein:

the semiconductor memory device accesses the memory cells to provide read data from some of the accessed memory cells and to refresh other of the accessed memory cells, the memory cells that provide read data being coupled to a first memory cell group, the memory cells that are to be refreshed being coupled to at least a second memory cell group; and the timing circuit activates the control signal of the first sense amplifier group prior to the control signal of the at least second sense amplifier group.

6. The sensing scheme of claim 4, wherein:

the sense amplifier bank includes $2^m$ sense amplifier groups; and the timing circuit receives address information that includes m address values.

* * * * *